United States Patent
Brodsky et al.

(10) Patent No.: US 6,323,130 B1
(45) Date of Patent: Nov. 27, 2001

(54) METHOD FOR SELF-ALIGNED FORMATION OF SILICIDE CONTACTS USING METAL SILICON ALLOYS FOR LIMITED SILICON CONSUMPTION AND FOR REDUCTION OF BRIDGING

(75) Inventors: Stephen Bruce Brodsky, Wappingers Falls; Cyril Cabral, Jr., Ossining; Roy Arthur Carruthers, Stormville; James McKell Edwin Harper, Yorktown Heights; Christian Lavoie, Ossining; Patricia Ann O'Neil, Wappingers Falls; Yun Yu Wang, Poughguag, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/515,033

(22) Filed: Mar. 6, 2000

(51) Int. Cl.$^7$ .................................................. H01L 21/44
(52) U.S. Cl. .................... 438/682; 438/630; 438/649; 438/655
(58) Field of Search .................... 438/630, 649, 438/655, 682

(56) References Cited

U.S. PATENT DOCUMENTS

| | | | |
|---|---|---|---|
| 5,356,837 | * 10/1994 | Geiss et al. | 438/535 |
| 5,449,642 | * 9/1995 | Tan et al. | 438/151 |
| 5,510,295 | 4/1996 | Cabral, Jr. et al. | 438/656 |
| 5,608,226 | 3/1997 | Yamada et al. | 250/411.1 |
| 5,624,869 | 4/1997 | Agnello et al. | 438/602 |
| 5,828,131 | 10/1998 | Cabral, Jr. et al. | 257/757 |

OTHER PUBLICATIONS

M. Lawrence, et al., "Growth of Epitaxial CoSi$^2$ on (100) Si," Appl. Phys. Lett., vol. 58, No. 12, pp. 1308–1310 (1991).

C. Cabral, et al., "In–Situ X–Ray Diffractin and Resistivity Analysis of CoSi2 Phase Formation With and Without a Ti Interlayer at Rapid Thermal Annealing Rates," Mat. Res. Soc. Symp. Proc., vol. 375, pp. 253–258 (1995).

* cited by examiner

Primary Examiner—Charles Bowers
Assistant Examiner—William M. Brewster
(74) Attorney, Agent, or Firm—Scully, Scott, Murphy & Presser; Robert M. Trepp

(57) ABSTRACT

A method of substantially reducing Si consumption and bridging during metal silicide contact formation comprising the steps of: (a) forming a metal silicon alloy layer over a silicon-containing substrate containing an electronic device to be electrically contacted, said silicon in said alloy layer being less than about 30 atomic % and said metal is Co, Ni or mixtures thereof; (b) annealing said metal silicon alloy layer at a temperature of from about 300° to about 500° C. so as to form a metal rich silicide layer that is substantially non-etchable compared to said metal silicon alloy or pure metal; (c) selectively removing any non-reacted metal silicon alloy over non-silicon regions; and (d) annealing said metal rich silicide layer under conditions effective in forming a metal silicide phase that is in its lowest resistance phase. An optional oxygen barrier layer may be formed over the metal silicon alloy layer prior to annealing step (b).

16 Claims, 4 Drawing Sheets

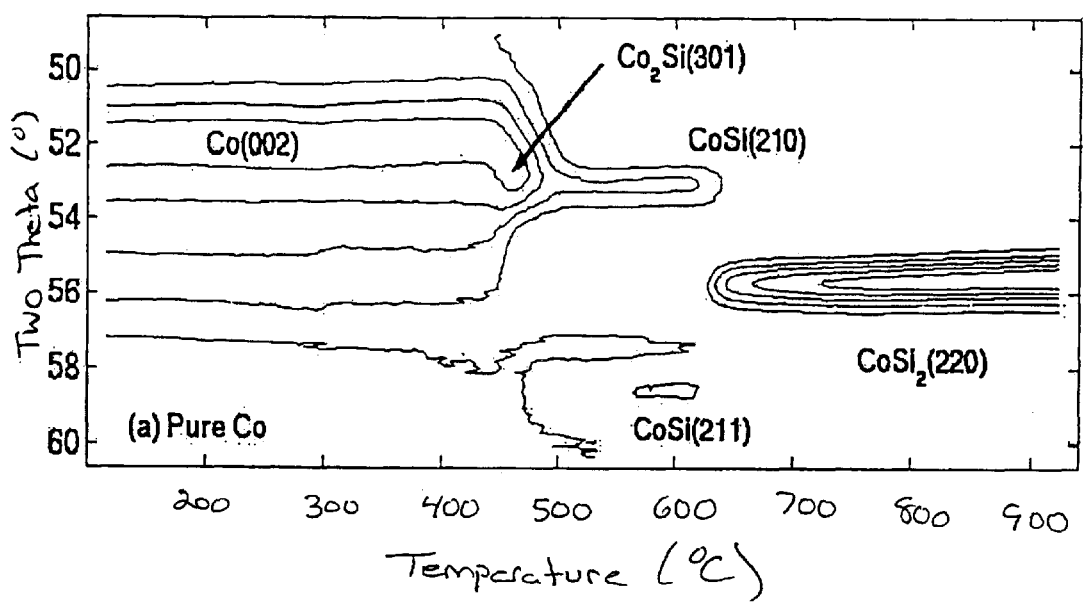
FIG. 2a (Prior Art)
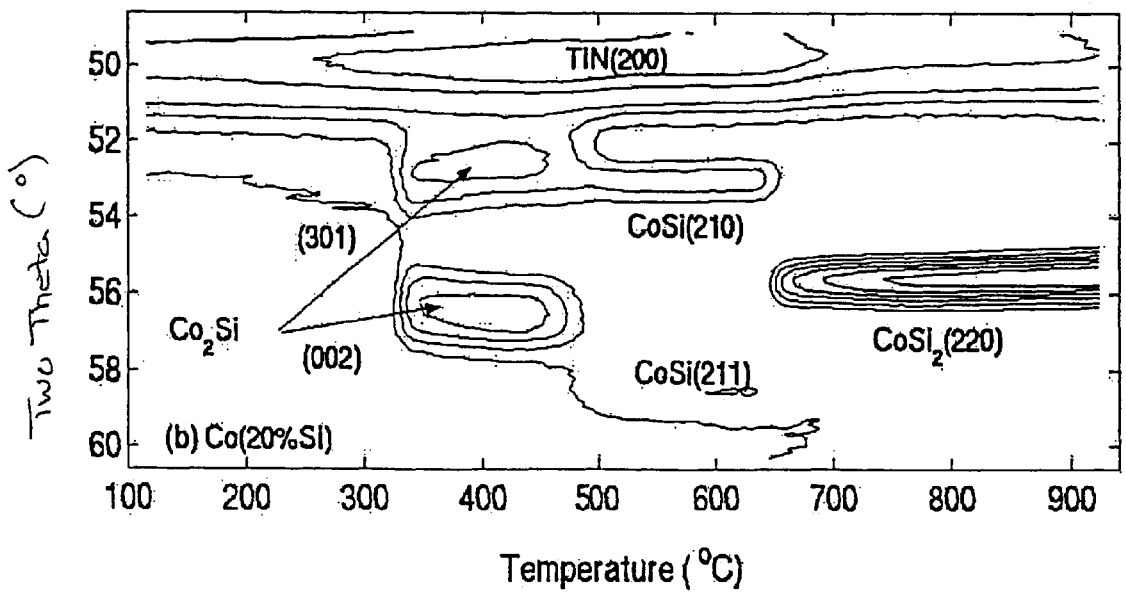
FIG. 2b (Invention)

METHOD FOR SELF-ALIGNED FORMATION OF SILICIDE CONTACTS USING METAL SILICON ALLOYS FOR LIMITED SILICON CONSUMPTION AND FOR REDUCTION OF BRIDGING

FIELD OF THE INVENTION

The present invention relates to complementary metal oxide semiconductor (CMOS) manufacturing, and more particular to a method for limiting silicon consumption and reducing bridging during silicide contact formation by using a metal silicon alloy as the starting material for the silicide contact.

BACKGROUND OF THE INVENTION

One type of material commonly employed in fabricating ohmic contacts is metal silicides such as cobalt silicide. Cobalt silicide and other metal silicides are typically fabricated using a conventional self-aligned silicide (salicide) process, wherein a blanket TiN/Co film is deposited over the devices and annealed to form cobalt monosilicide over the exposed silicon regions (source, drain and gate) of transistors in USLI integration. A selective wet etch is employed to remove the TiN cap and the non-reacted cobalt left over the oxide or nitride regions. The cobalt monosilicide is then subjected to a second anneal which converts the monosilicide into a cobalt disilicide layer. The cobalt disilicide phase has a lower resistance than the cobalt monosilicide phase.

The above self-aligned silicide process cannot be performed using a single anneal because of the diffusion of silicon (Si) atoms in the cobalt (Co) film along the sidewalls of the transistor. If the first anneal is at too high a temperature, Si can diffuse in the cobalt over the oxide/nitride regions of the device and will not be removed by the etch so that the source and drain areas become shorted to the gate. This phenomenon is known in the art as bridging. The self-aligned silicide process relies on the selective wet etch for removing any left over metal alloy or metal from the exposed nitride/silicon regions. As the device dimensions are further reduced, the constraints on the Si diffusion will become more stringent.

Moreover, and as one skilled in the art is aware, the silicide formation consumes a considerable amount of silicon. The thickness of Si consumption for a Co disilicide film is 3.6 times that of the initial cobalt film. As the junction depth of active regions becomes shallower, this large Si consumption becomes a problem.

In view of the above drawbacks with prior art salicide processes, there is a continued need for developing a new and improved method that is capable of limiting silicon consumption and reducing bridging during metal silicide formation.

SUMMARY OF THE INVENTION

One object of the present invention is to provide a method of substantially limiting Si consumption during the formation of low resistivity metal silicide contacts.

Another object of the present invention is provide a method of substantially reducing Si diffusion that may cause bridging during the formation of low resistivity metal silicide contacts.

A further object of the present invention is to provide a method wherein the anneal temperature used in forming a substantially non-etchable metal silicide layer is considerably lower compared to conventional salicide processes. The term "substantially non-etchable" denotes a material that is more difficult to etch than the starting metal silicon alloy or the pure metal in the etchant solutions mentioned hereinbelow.

A still further object of the present invention is to provide a method wherein the annealing step prior to the selective etching is capable of forming a metal rich silicide layer that is substantially non-etchable.

These and other objects and advantages are achieved in the present invention by utilizing a metal silicon alloy as the starting material in fabricating metal silicide contacts. The use of a metal silicon alloy as the silicide starting material significantly limits the Si consumption and reduces bridging during metal silicide contact formation. Bridging is limited since the metal silicon alloy enhances the formation of a metal rich silicide phase in such a way that the temperature of the first anneal (i.e., the anneal prior to etching) can be significantly reduced.

Applicants have unexpectedly determined in this regard that the use of a metal silicon alloy reduces the temperature for the formation of the metal rich silicide phase by more than 150° C. Additionally, applicants have unexpectedly determined that the use of a metal silicon alloy provides a much wider anneal temperature range for the formation of the metal rich silicide phase as compared to prior art salicide processes. Moreover, applicants have determined that the use of a metal silicon alloy provides a substantially non-etchable film at lower temperatures than heretofore possible utilizing prior art salicide processes.

The method of the present invention which provides these unexpected findings comprises the steps of:

(a) forming a metal silicon alloy layer over a silicon-containing substrate containing an electronic device to be electrically contacted, said silicon in said alloy layer being less than about 30 atomic % and said metal is Co, Ni or mixtures thereof;

(b) annealing said metal silicon alloy layer at a temperature of from about 300° to about 500° C. so as to form a metal rich silicide layer that is substantially non-etchable compared to the metal silicon alloy layer or pure metal;

(c) selectively removing any non-reacted metal silicon alloy over non-silicon regions; and (d) annealing said metal rich silicide layer under conditions effective in forming a metal silicide phase that is in its lowest resistance phase.

An optional oxygen barrier layer may be formed over the metal silicon alloy layer prior to annealing step (b).

When Ni is employed as the metal, a Ni rich silicide phase is formed after annealing step (b). Annealing step (d) converts the Ni rich silicide phase into Ni monosilicide which represents the lowest resistance silicide phase of Ni. On the other hand, when Co is employed, annealing step (b) converts the Co—Si alloy layer into a Co rich silicide layer and annealing step (d) converts the metal rich silicide phase into a Co disilicide phase which represents the lowest resistance silicide phase of Co.

BRIEF DESCRIPTION OF THE DRAWING

FIGS. 2a–2b are contour plots showing the diffracted x-ray intensity of crystalline phases in-situ as a function of temperature during silicide formation. FIG. 2a represents Co disilicide formed from a pure Co film (prior art), and FIG. 2b represents Co disilicide formed from a Co film containing 20 atomic % Si (invention).

DETAILED DESCRIPTION OF THE INVENTION

Figure 1A:
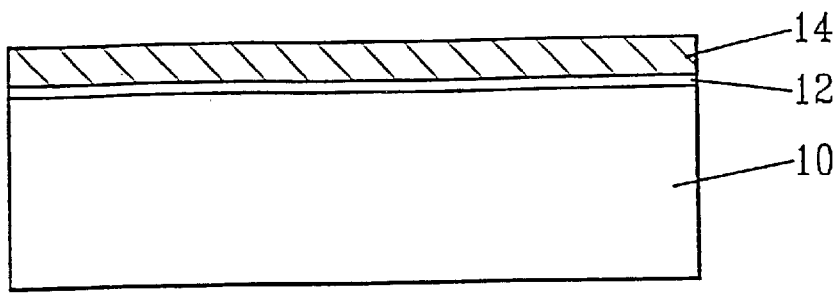
FIGS. 1a–1e are cross-sectional views illustrating various structures that are formed during the different processing steps of the present invention.

The present invention, which is directed to a method for reducing bridging and silicon consumption during the formation of low resistance metal silicide contacts, will now be described in greater detail by referring to the drawings that accompany the present application. It should be noted that in the accompanying drawings like and/or corresponding elements are referred to by like reference numerals.

Reference is first made to FIGS. 1a–e which illustrate the basic processing steps of the present invention that are capable of forming a CMOS structure containing a low resistance metal silicide contact in which the Si consumption and the bridging has been significantly reduced. Specifically, the structure shown in FIG. 1a comprises a Si-containing substrate 10 which has a metal silicon alloy layer 14 formed thereon. The Si-containing substrate may optionally include a thin oxide layer 12 that is present near the surface of the Si-containing substrate; the oxide layer is present before alloy deposition and is at the interface between the alloy layer and the Si-containing substrate.

Suitable Si-containing substrates that can be used herein include, but are not limited to: single crystal Si, polycrystalline Si, SiGe, amorphous Si, silicon-on-insulator (SOI) and other like Si-containing materials. The Si-containing substrate may be doped or undoped and it may contain various isolation and device regions therein. These regions are not shown in the drawings but are nevertheless intended to be included in region 10.

It is noted that the Si-containing substrate includes at least one electrical device that needs to be electrically contacted. Typically, the oxide layer is a thin oxide having a thickness of from about 0.1 to about 3.0 nm.

In one embodiment of the present invention, oxide layer 12 is completely removed from the structure prior to employing the method of the present invention. In this embodiment, HF may be used to completely remove the oxide layer from the structure prior to forming the metal Si alloy layer thereon.

The metal silicon alloy layer is formed on the surface of substrate 10 (or over oxide layer 12) using conventional deposition processes that are well known to those skilled in the art. For example, the alloy layer may be formed by chemical vapor deposition, plasma-assisted chemical vapor deposition, evaporation, sputtering and other like deposition processes. Of these techniques, it is preferred to form the alloy layer by sputtering. Alternatively, the metal-Si alloy layer may be formed by first depositing a metal layer on the surface of the Si-containing substrate, and thereafter doping the metal layer with at least Si utilizing ion-implantation or other like doping process.

The metal silicon alloy layer of the present invention comprises at least one metal selected from the group consisting of Co, Ni and mixtures thereof. That is, layer 14 may comprise a Co—Si alloy, a Ni—Si alloy, or a mixture of metals such as Co—Ni—Si. Of these alloys, it is preferred that the metal silicon alloy comprise a Co—Si alloy. The metal silicon alloy layer of the present invention includes less than about 30 atomic % Si. More preferably, silicon is present in the alloy layer in an amount of from about 0.1 to about 20 atomic %.

The metal silicon alloy layer of the present invention may also include at least one additive, said at least one additive being selected from the group consisting of C, Al, Ge, Sc, Ti, V, Cr, Mn, Fe, Cu, Y, Zr, Nb, Mo, Ru, Rh, Pd, In, Sn, La, Hf, Ta, W, Re, Ir, Pt, Ce, Pr, Nd, Sm, Eu, Gd, Tb, Dy, Ho, Er, Tm, Yb, Lu and mixtures thereof. Of these additives C, Al, Ge, Sc, Ti, V, Cr, Mn, Fe, Cu, Y, Zr, Nb, Mo, Ru, Rh, Pd, In, Sn, La, Hf, Ta, W, Re, Ir, Pt or mixtures thereof are preferred.

When an additive is present, the at least one additive is present in an amount of from about 0.01 to about 50 atomic (at.) %, with a range of from about 0.1 to about 20 at. % being more preferred.

The term "metal silicon alloy" is used herein to include Co, Ni or CoNi compositions that have a uniform or non-uniform distribution of silicon therein; Co, Ni or CoNi compositions having a gradient distribution of silicon therein; or mixtures and compounds thereof.

Figure 1B:
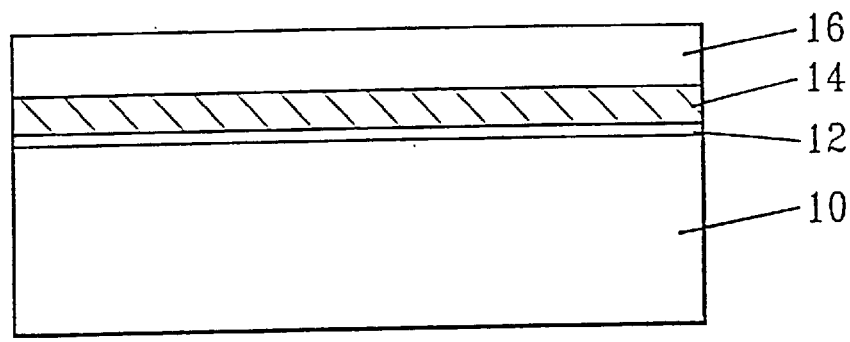

Next, as shown in FIG. 1b, an optional oxygen barrier layer 16 may be formed on the surface of metal silicon alloy layer 14. The optional oxygen barrier layer is formed using conventional deposition processes that are well known to those skilled in the art. Illustrative examples of suitable deposition processes that can be employed in the present invention in forming the optional oxygen barrier layer include, but are not limited to: chemical vapor deposition, plasma-assisted chemical vapor deposition, sputtering, evaporation, plating, spin-on coating and other like deposition processes. The thickness of the optional oxygen barrier layer is not critical to the present invention as long as the oxygen barrier layer is capable of preventing oxygen or another ambient gas from diffusing into the structure. Typically, the optional oxygen barrier layer has a thickness of from about 10 to about 30 nm.

The optional oxygen barrier is composed of conventional materials that are well known in the art for preventing oxygen from diffusing into the structure. For example, TiN, $Si_3N_4$, TaN and other like materials can be employed as the oxygen barrier layer. Although the drawings of the present invention show the presence of the optional barrier layer, it is possible to use the method of the present invention in cases wherein the optional barrier layer is not present.

Figure 1C:
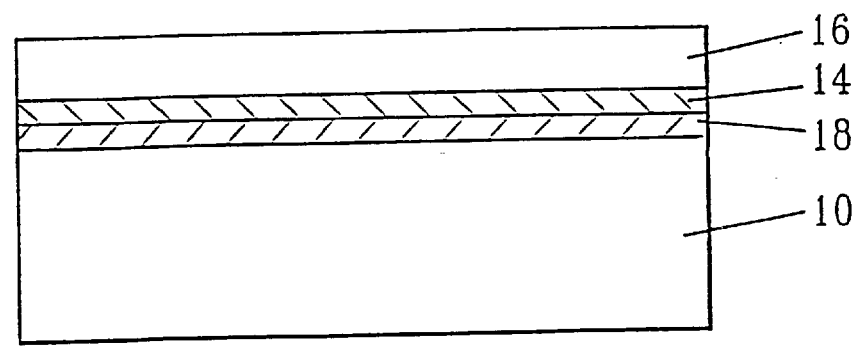
Figure 1D:
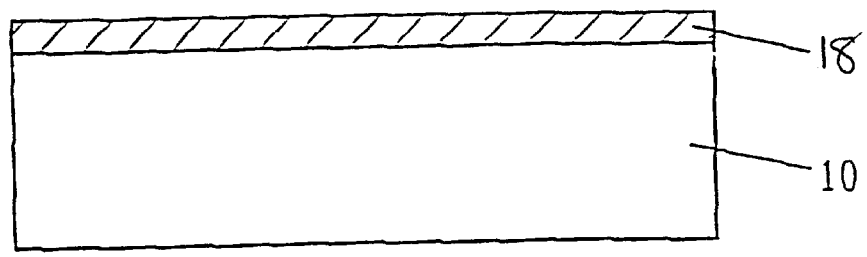

In accordance with the next step of the present application, See FIG. 1c, a first annealing step is carried out on the structure shown in FIG. 1b so as to form a metal rich silicide layer 18 in the structure. During the first annealing step, the thin oxide layer would be present in the metal rich silicide layer. The metal rich silicide phase is formed by utilizing a rapid thermal anneal (RTA) process using a gas atmosphere, e.g., He, Ar, Ne or forming gas, at a temperature of from about 300° to about 500° C. for a time period of about 300 seconds or less using a continuous heating regime or a ramp and soak heating regime. Other temperatures and times are also contemplated herein so long as the conditions chosen are capable of forming metal rich silicide layer 18 in the structure. During this annealing step all of silicon alloy layer 14 may be consumed, or alternatively some of the alloy layer may remain after annealing. This latter embodiment is shown in FIG. 1c.

It is noted that the above annealing conditions form a metal rich silicide layer that is substantially non-etchable compared to the starting metal silicon alloy or pure metal; therefore higher annealing temperatures typically used in providing this non-etchable metal silicide layer are avoided. Moreover, applicants have unexpectedly determined that the use of a metal silicon alloy permits the formation of a metal rich silicide layer at lower temperatures than heretofore possible utilizing prior art processes. Since lower temperatures are used in forming the metal rich silicide layer, the tendency for bridging is drastically reduced. Moreover, since the initial film contains silicon therein, a reduction in silicon consumption is observed during the formation of the low resistance metal silicide contact.

After the first annealing step, optional oxygen diffusion barrier 16 and any remaining metal silicon alloy layer 14 (or any pure metal layer) is selectively removed from the structure (See, FIG. 1d) using conventional etching techniques that are well known to those skilled in the art. For example, any wet etch process may be used in removing the optional oxygen barrier layer and the metal silicon alloy layer from the structure. The chemical etchant employed in the wet etch process must be highly selective in removing the oxygen barrier layer and the metal silicon alloy layer as compared to the metal rich silicide layer. A suitable etchant that can be employed in the present invention is a mixture of hydrogen peroxide and nitric or sulfuric acid. Other chemical etchants can also be employed in the present invention.

It is also within the contemplation of the present invention to use a dry etch process in removing the optional oxygen barrier layer and any remaining metal silicon alloy layer from the structure. Suitable dry etching techniques that can be used herein include, but are not limited to: reactive-ion etching, ion beam etching, plasma etching and other like dry etching techniques.

After removing the optional barrier layer and any unreacted metal silicon alloy from the structure, a second annealing step is employed in the present invention to convert the metal rich silicide layer into a Co or Ni silicide phase of lowest resistance, i.e., Co disilicide or Ni monosilicide. The second annealing step is carried out at a temperature that is higher than the temperature used in the first annealing step. The second annealing step is thus carried out under conditions that are effective in converting silicide layer 18 into a silicide layer 20 having the lowest resistance silicide phase of the metal.

Figure 1E:
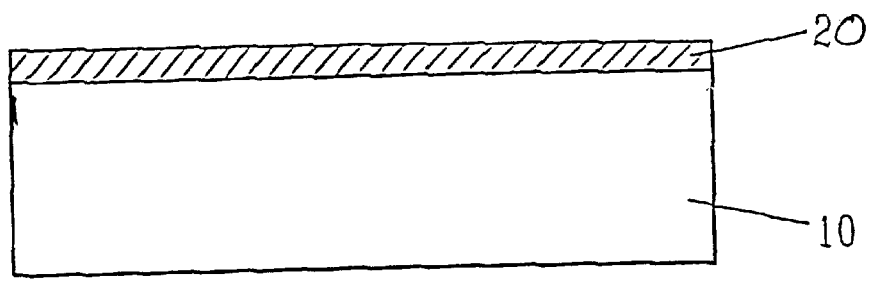

This second annealing step is also carried out by RTA using a gas ambient. Typically, the second annealing step is carried out at a temperature of from about 600° to about 900° C. for a time period of about 300 seconds or less using a continuous heating regime or a ramp and soak heating regime. Other temperatures and times are also contemplated herein so long as the conditions chosen are higher than the first anneal steps so that the lowest resistance silicide phase of Co or NI is formed in the structure. The resultant structure that is obtained using the second annealing step of the present invention is shown in FIG. 1e.

It is again emphasized that the present invention provides the following two advantages: a substantial reduction in Si consumption and a drastic reduction in the tendency for bridging. For example, when a Co film containing 20 atomic % Si is employed, there is a 13% reduction in Si consumption when forming Co disilicide (a 25% reduction in Si consumption is present when forming Ni monosilicide). Moreover, since the metal rich silicide phase crystalizes at a much lower temperature, the tendency for bridging has been reduced.

The electrical contact of the present invention thus comprises a substrate 10 having an exposed region of a silicon-containing semiconductor material and a first layer of a metal silicide 20, wherein said metal silicide is its lowest resistance phase, i.e., Co disilicide or Ni monosilicide.

The present examples are given to illustrate the present invention and to demonstrate some of the advantages that can arise therefrom.

EXAMPLES

In these examples, a structure containing a Co disilicide was prepared from pure Co using a conventional salicide process (representative of the prior art) and that structure was compared to a structure containing a Co disilicide contact made in accordance with the present invention, i.e., a Co—Si alloy was used as the silicide starting material. Specifically, the prior art structure was prepared by depositing a blanket TiN/Co film over a Si substrate and the structure was then subjected to RTA (T of about 550° C.) to form Co monosilicide over the exposed silicon regions (source, drain and gate) of the transistors. A selective wet etch was employed to remove the TiN cap and the non-reacted Co left over the oxide or nitride regions. The Co monosilicide thus formed was then subjected to a second anneal (T about 750° C.) to form a Co disilicide layer.

In the other structure, a Co—Si alloy (containing about 20 atomic % Si) was used instead of the pure Co and the above processing conditions were then used to form a Co disilicide layer on the substrate with the exception of the first anneal which was conducted at a temperature of about 400° C. so that a metal rich Co silicide layer was obtained.

The silicide phase formation sequences for the two Co films deposited on a single crystal Si substrate are shown in FIGS. 2a (pure Co, prior art) and 2b (Co—Si alloy, invention). The contours represent the diffracted x-ray intensity at a two theta angle given by the y-axis and a temperature given by the x-axis. The samples were annealed at 3° C./sec in purified $N_2$.

In FIG. 2a, the Co(002) peak is present up to 430° C. at which temperature the metal rich phase forms. The temperature range in which this phase is present is followed by the CoSi (Co monosilicide) phase around 480° C. The $CoSi_2$ (cobalt disilicide) appears at about 640° C. Although the phase sequence is the same for a Co (20 at. % Si) film, there are a few differences, namely the starting texture of the film and temperature range over which each phase is present.

In FIG. 2b, it can be seen that the initial texture of the film is different as the Co (002) peak is not observed. The lack of orientation in the Co layer also promotes a different orientation of the TiN capping layer. The TiN (200) peak is present slightly below 50 degrees (2 theta). The most important difference is that the metal rich phase forms around 330° C.; this is about 100° C. below the standard formation temperature. This is usually the temperature at which abnormal grain growth is observed in the Co (002) grains. It is believed that the driving force for the grain growth initiates the crystallization of the metal rich phase. The Co metal rich silicide phase is present up to a similar temperature as that of the pure Co film. Not surprisingly, the temperature ranges for Co monosilicide and Co disilicide are similar. No major differences are expected since the additive element (Si) intermixes with other silicon atoms from the substrate. Beside the texture of the TiN which may affect the surface energies, the composition of the layer should be the same as soon as the temperature reaches close to 500° C.

In the standard self-aligned silicide process, the first anneal temperature is selected to form the monosilicide (about 550° C. in FIG. 2a). Since the temperature window over which the metal rich phase is present is so narrow (and varying with dopant and type of substrate), it is not reasonable to try to form only this phase during the first anneal.

However, when 20% Si is mixed with the Co, the metal rich phase forms at much lower temperature and it can be formed reliably during a first anneal since it extends over a much larger temperature range. The bridging is limited not only because of the lower temperature but also because only 25% of the Si diffusion is required to form the first phase compared to the usual Co monosilicide formation.

Figure 3A:
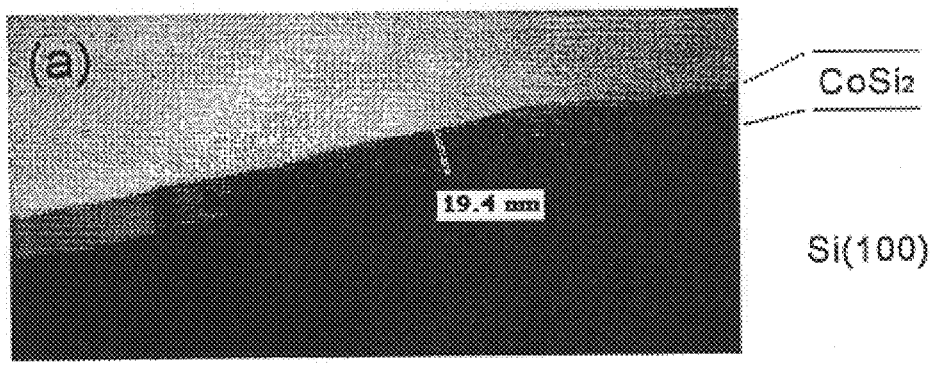
FIGS. 3a–3b are transmission electron microscopy (TEM) images of $CoSi_2$ formed on Si(100) and polysilicon, respectively, using a Co—Si alloy (20 atomic % Si).
Figure 3B:
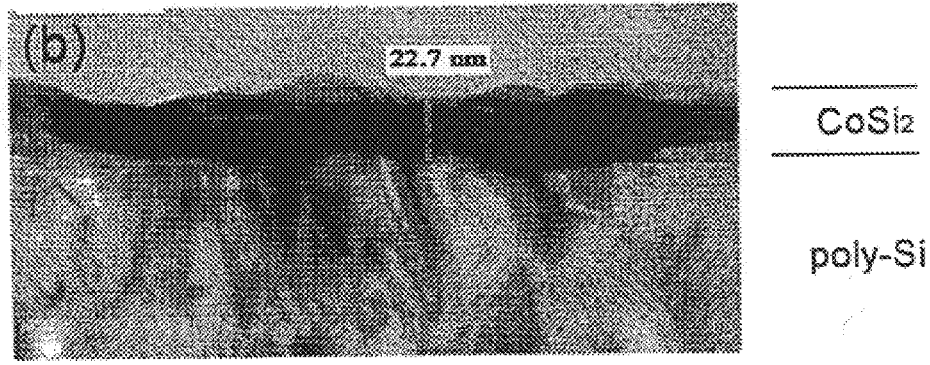

Cross section TEM images of the cobalt disilicide on both Si (100) (a) and poly-Si (b) substrates starting with a Co (20 at. % Si) film are shown in FIGS. 3a and 3b. The first anneal of the self-aligned silicide process was lowered to about 400° C. From these images, it is clear that the selective etch did not remove the Co rich silicide phase. The starting equivalent Co thickness is about 7 nm. If the selective etch does not remove any Co, the formation should lead to 25 nm of $CoSi_2$. Even if for both samples, the final thickness is lower than expected, the film is thick and uniform enough for microelectronics applications.

Proposing a Si containing alloy for self-aligned silicide, it must be verified that the annealed film can be etched from oxide regions. Cobalt films with various silicon concentration were deposited on silicon oxide films (and on Si (100) substrates) and annealed at a temperature sufficient to form the cobalt monosilicide phase starting from a pure cobalt film (550° C.). The resulting films are then subject to a standard selective etch to determine the Si concentration range for which the film can be removed from the oxide regions. The measured sheet resistances after anneal and selective etch are presented in table 1.

TABLE 1

| Si composition Determined by RBS | Film Thickness (nm) Determined by RBS | Pure Co equivalent Thickness (nm) | Sheet Resistance after etch (Ohms/sq.) [film on Si (100)] | Sheet Resistance after etch (Ohms/sq.) [film on oxide] |
|---|---|---|---|---|
| 28% | 14.9 | 8.7 | 197 | 700 |
| 22% | 12.8 | 8.5 | 196 | >2E6* |
| 15% | 10.8 | 8.2 | 198 | >2E6* |
| 10% | 9.1 | 7.7 | 190 | >2E6* |
| 0% | 7.3 | 7.3 | 210 | >2E6* |

*The sheet resistance of >2E6 means larger than the maximum measurable value (highest scale).

It is clear from the table that even with 22% Si in the Co, the film is completely removed from the oxide areas. For the Co 28% Si, the resistance of the film on oxide is still larger than for the CoSi (197 Ohms/sq.). For this film, the etch only removes part of the film over oxide areas showing that this concentration is too high for a self-aligned process. Concentrations of 22% or lower can be used, with a higher boundary of 30 at. %, at an annealing temperature of 400° C. Note that the silicon content could be higher than 22% considering that the first anneal temperature can be much lower than that used for the films in the table above (550° C. for 80s).

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method for reducing the silicon consumption and the bridging during metal silicide contact formation comprising the steps of:

(a) forming a metal silicon alloy layer over a silicon-containing substrate containing an electronic device to be electrically contacted, said silicon in said alloy layer being less than about 30 atomic % and said metal is Co, Ni or mixtures thereof;

(b) annealing said metal silicon alloy layer at a temperature of from about 300° to about 500° C. so as to form a metal rich silicide layer that is substantially non-etchable compared to the metal silicon alloy or pure metal;

(c) selectively removing any non-reacted metal silicon alloy over non-silicon regions; and (d) annealing said metal rich silicide layer under conditions effective in forming a metal silicide phase that is in its lowest resistance phase.

2. The method of claim 1 wherein said metal silicon alloy layer is formed by a deposition process selected from the group consisting of chemical vapor deposition (CVD), plasma-assisted CVD, sputtering and evaporation, or said metal silicon alloy layer is formed by first depositing said metal to form a metal layer and then doping said metal layer with silicon.

3. The method of claim 1 further comprising forming an optional barrier layer over said metal silicon alloy layer prior to step (b), wherein said optional barrier layer is removed by step (c).

4. The method of claim 1 wherein said metal silicon alloy layer further includes at least one additive selected from the group consisting of C, Al, Ge, Sc, Ti, V, Cr, Mn, Fe, Cu, Y, Zr, Nb, Mo, Ru, Rh, Pd, In, Sn, La, Hf, Ta, W, Re, Ir, Pt, Ce, Pr, Nd, Sm, Eu, Gd, Tb, Dy, Ho, Er, Tm, Yb, Lu and mixtures thereof.

5. The method of claim 4 wherein said additive is C, Al, Ge, Sc, Ti, V, Cr, Mn, Fe, Cu, Y, Zr, Nb, Mo, Ru, Rh, Pd, In, Sn, La, Hf, Ta, W, Re, Ir, Pt or mixtures thereof.

6. The method of claim 1 wherein said metal silicon alloy layer contains from about 0.1 to about 20 atomic % Si.

7. The method of claim 1 wherein said metal of said metal silicon alloy layer is Co.

8. The method of claim 3 wherein said optional oxygen barrier layer is composed of TiN.

9. The method of claim 1 wherein said silicon-containing substrate comprises a single crystal Si, polycrystalline Si, SiGe, amorphous Si, or a silicon-on-insulator (SOI).

10. The method of claim 1 wherein said annealing step (b) is carried out by RTA.

11. The method of claim 10 wherein said RTA is carried out for a time period of about 300 seconds or less.

12. The method of claim 1 wherein step (c) includes a wet etch process, wherein a chemical etchant is employed.

13. The method of claim 1 wherein said second annealing step is carried out by RTA.

14. The method of claim 13 wherein said RTA is carried out at a temperature of from about 700° to about 900° C. for a time period of about 300 seconds or less.

15. The method of claim 1 wherein said metal is Ni and Ni monosilicide is formed after step (d).

16. The method of claim 1 wherein said metal is Co and Co disilicide is formed after step (d).

* * * * *